United States Patent [19]
Goldfarb et al.

[11] Patent Number: 5,939,884
[45] Date of Patent: Aug. 17, 1999

[54] METHOD FOR IDENTIFYING SPIKES IN MR SIGNALS

[75] Inventors: James W. Goldfarb, Poughkeepsie, N.Y.; Franz Schmitt, Erlangen, Germany

[73] Assignee: Siemens Aktiengesellschaft, Munich, Germany

[21] Appl. No.: 08/839,900

[22] Filed: Apr. 18, 1997

[30] Foreign Application Priority Data

Apr. 24, 1996 [DE] Germany ............................ 196 16 390

[51] Int. Cl.⁶ ....................................................... G01V 3/170
[52] U.S. Cl. ......................... 324/322; 324/322; 324/309; 324/307; 324/310; 324/311; 324/312; 324/318; 324/300; 364/413.2
[58] Field of Search .................................... 324/322, 309, 324/307, 310, 311, 312; 364/413.2, 318, 300

[56] References Cited

U.S. PATENT DOCUMENTS

| | | | |
|---|---|---|---|
| 5,248,943 | 9/1993 | Fox et al. | 324/322 |
| 5,297,033 | 3/1994 | Bito et al. | 364/413.2 |
| 5,436,564 | 7/1995 | Kreger et al. | 324/322 |
| 5,525,906 | 6/1996 | Goldfarb et al. | 324/322 |
| 5,561,724 | 10/1996 | Kodo et al. | 383/264 |
| 5,602,934 | 2/1997 | Li et al. | |

OTHER PUBLICATIONS

"Spike Removal From MR Raw Data Sets," Spraggins, Journal of Magnetic Resonance Imaging, 2P, p. 789 (1992).
"Restoration of Corrupted k–space Raw Data for Removing Striation Artifacts on Images," Kao et al., Proceedings of the SMR (1995), p. 760.
"Transient Noise Suppression Using Common Mode Detection and Receiver Blanking," Crawford et al., Proceedings of the SMR (1995), p. 939.
"Rejection of Spike Noise from Size Exclusion Chromatography/Low–Angle Laser Light Scattering Experiments," Berkowitz, Analytical Chemistry, vol. 58 (1986) pp. 2571–2576.
"Improved Representation of Two–Dimensional NMR Spectra by Local Rescaling," Neidig et al., Journal of Magnetic Resonance, vol. 88 (1990) pp. 155–160.

*Primary Examiner*—John Barlow
*Assistant Examiner*—Brij B. Shrivastav
*Attorney, Agent, or Firm*—Hill & Simpson

[57] ABSTRACT

In a method for identifying spikes in magnetic resonance signals obtained in magnetic resonance tomography, a magnetic resonance signal is obtained and is high-pass filtered. A statistical evaluation of the high-pass filtered magnetic resonance signal is then undertaken to determine whether the high-pass filtered magnetic resonance signal contains spikes which can be differentiated from a noise signal. If so, such spikes are identified, and can be removed from the raw data so that they do not contribute to image artifacts.

11 Claims, 3 Drawing Sheets

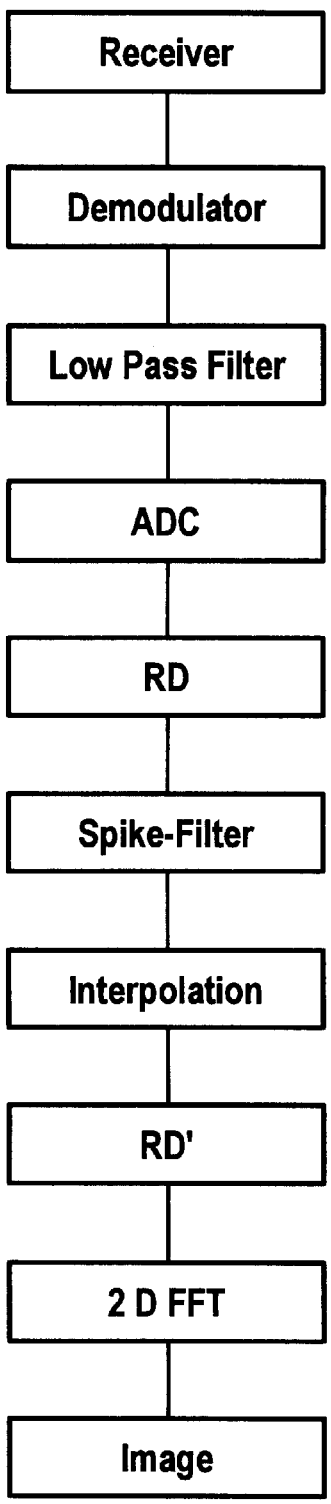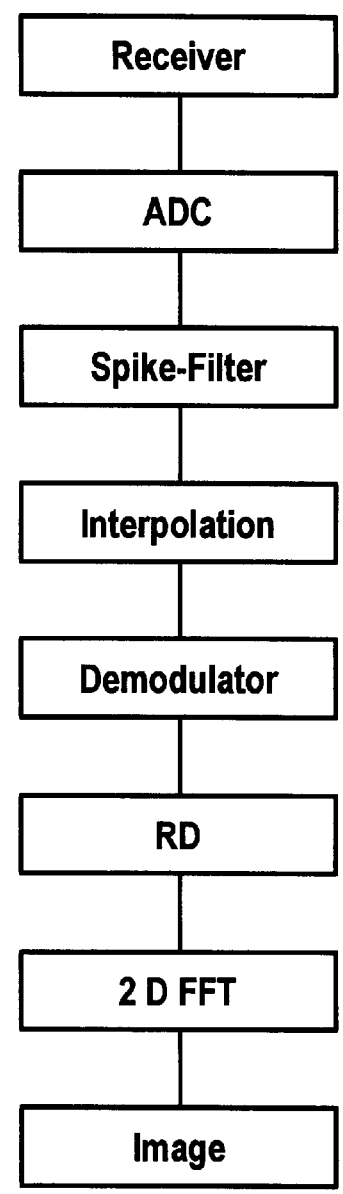
FIG 1
FIG 2

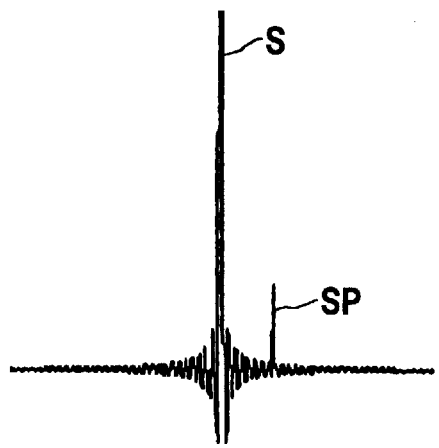
FIG 3a
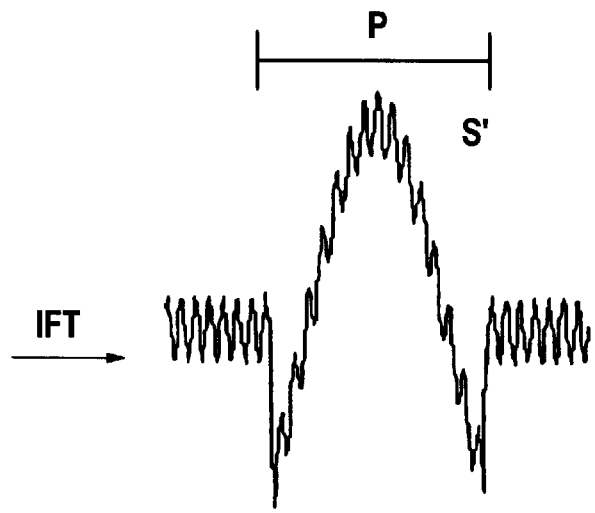
FIG 3b
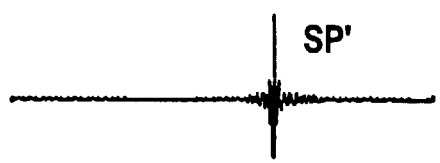
FIG 3d
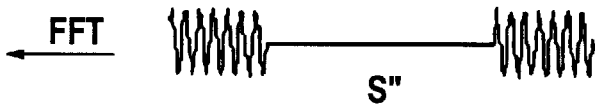
FIG 3c
FIG 3

METHOD FOR IDENTIFYING SPIKES IN MR SIGNALS

BACKGROUND OF THE INVENTION

1. Field of the Invention

The present invention is directed to a method for identifying spikes which arise in MR signals obtained in nuclear magnetic resonance tomography.

2. Description of the Prior Art

Spike signals are occasionally present which disturb the measured values in nuclear magnetic resonance tomography. For example, spikes can arise due to electrostatic discharges or mains disturbances. Two or more spikes can already make an image diagnostically valueless, so that the entire measurement must be repeated. A number of methods were therefore developed for blanking unavoidable spikes out of the measured signals. Initially, there is the problem of identifying spikes as such. The most obvious way is to interpret signals whose amplitude exceeds the MR signal as spikes. However, all spikes cannot be acquired in this way since their amplitude can also lie in the region of the values for the MR signal. After the process of identification, the position of the spikes must be acquired and the disturbed samples must be replaced.

A number of methods have been proposed for solving the aforementioned problems. M. J. Sanz and E. M. Haacke, Journal of Magnetic Resonance Imaging, 2 P, 789, 1992, and Y. Kao and J. R. Mac Fall, Proceedings of the SMR 760, 1995 propose using information from a region of uniform material. C. R. Crawford et al, Proceedings SMR, 939, 1995, propose employment of a high-pass filter in order to identify unwanted signals. In the field of chromatography, this method was also proposed S. A. Berkowitz, Analytical Chemistry 58, 2571–2576, 1986.

The problem of separating spike signals from noise signals with adequate reliability, however, has not been satisfactorily solved in any of these methods.

SUMMARY OF THE INVENTION

An object of the present invention is to provide a method that enables a reliable identification of spikes.

The above object is achieved in accordance with the principles of the present invention in a method wherein an MR signal is measured and high-pass filtered with the limit frequency of the high-pass filter selected such that an MR signal without spikes is filtered out. A statistical evaluation is then made to determine whether the high-pass filtered MR signal contains spikes that can be differentiated from a noise signal.

Spikes that are not distinguished by the amplitude can also be separated from MR signals by the high-pass filtering. Spikes can be separated from the noise signal with good reliability as the result of the subsequent statistical evaluation of the high-pass filtered MR signal.

DESCRIPTION OF THE DRAWINGS

FIG. 1 is a flow chart for a reception channel with n analog demodulator and low-pass filter in accordance with the invention.

FIG. 2 is a flow chart for a reception channel with a digital demodulator in accordance with the invention.

FIG. 3 is a diagram directed to the software-related high-pass filtering in accordance with the invention.

DESCRIPTION OF THE PREFERRED EMBODIMENTS

Figure 4:
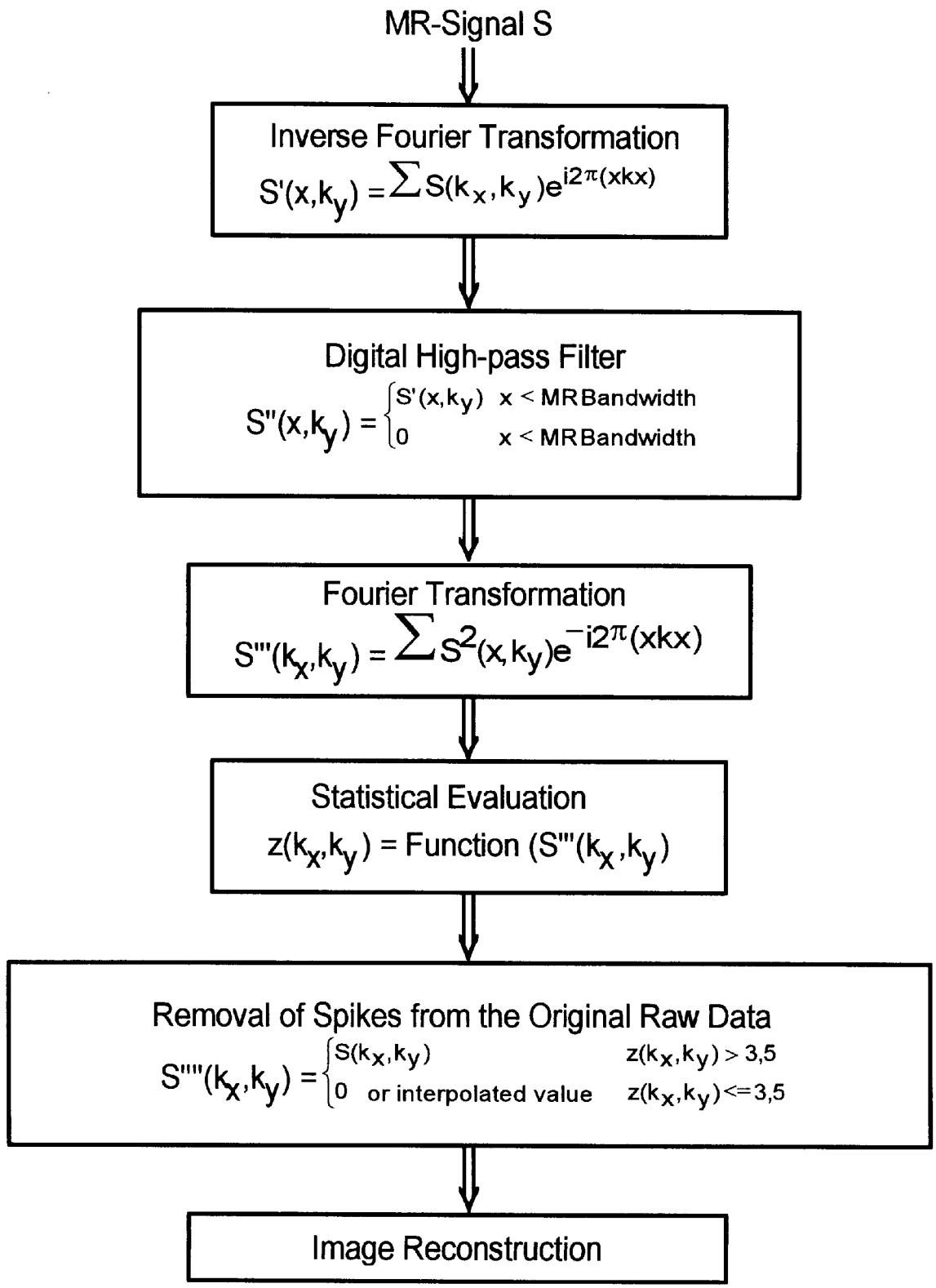
FIG. 4 is a flow chart for filtering, statistical evaluation and replacement of disturbed samples in accordance with the invention.

According to the flow chart of FIG. 1, the received MR signal samples are first demodulated in an analog demodulator in a conventional way and are supplied via a low-pass filter to an analog-to-digital converter. Over-convolution effects are avoided with the low-pass filter. The nuclear magnetic resonance signal is sampled in a fixed time grid with the analog-to-digital converter, and the acquired samples are entered into a row of a raw data matrix RD for each nuclear magnetic resonance signal. The so-called spin warp method has generally prevailed in nuclear magnetic resonance tomography, whereby each nuclear magnetic resonance signal is phase-encoded in a first direction and is frequency-encoded in a second direction. Each nuclear magnetic resonance signal is sampled N times and M signals with different phase-encoding are acquired, so that a raw data matrix with M rows each having N samples is obtained. The method can be expanded to three dimensions with a second phase-encoding gradient.

A spike filter is now applied to the raw data matrix; the function thereof shall be explained in greater detail below. If it is found with the assistance of the spike filter that a specific sample is disturbed by a spike, this sample is removed from the raw data matrix. In the simplest case, the disturbed sample can be set to zero; however, better results are obtained when it is replaced by an interpolation from neighboring values.

A modified raw data matrix RD' is obtained after this correction. On this basis of the standard application of a two-dimensional Fourier transformation (and a three-dimensional Fourier transformation as well in the three-dimensional case), the desired image wherein the disturbances due to spikes are eliminated is obtained.

There are also systems with a fully digital reception band wherein an analog-to-digital conversion is implemented immediately after the reception of the nuclear magnetic resonance signals. A flow chart for such a reception channel is schematically shown in FIG. 2. Here, the spike filter and the interpolation can be applied directly after the analog-to-digital conversion. Subsequently, a demodulation of the corrected nuclear magnetic resonance signals is implemented by a digital demodulator, and the acquired values are stored in a raw data matrix from which an image is acquired in a conventional way on the basis of two-dimensional Fourier transformation.

The method for identifying spikes is set forth below with reference to FIG. 3. FIG. 3a shows a nuclear magnetic resonance signal S that is disturbed by a spike signal SP. It becomes clear in this example that the spike signal SP cannot be simply separated from the nuclear magnetic resonance signal S on the basis of amplitude. A characteristic of the spike signal, however, is that it is extremely narrow in the time domain by definition, namely noticeably narrower than the nuclear magnetic resonance signal S. When an inverse Fourier transformation is then implemented, then the signal deriving from the spike signal SP will exhibit a significantly greater bandwidth in the frequency domain than the nuclear magnetic resonance signal S, whose bandwidth is indicated as P in FIG. 3b. This fact makes it possible to eliminate the part of the nuclear magnetic resonance signal in the time domain with a high-pass filtering (indicated as HPF in FIG. 3), so that a signal S" according to FIG. 3c is obtained that now only derives from the spike signal SP. This high-pass filtering is accomplished by setting the values of the signal S' to zero in a range corresponding to the bandwidth P of the nuclear magnetic resonance signal S. The part of the signal S' deriving from the nuclear magnetic resonance signal S is thus eliminated.

The original spike signal can in turn be reconstructed in the original time position by implementing a Fourier transformation (FFT) of the signal S", and thus one obtains the signal SP' of FIG. 3d.

As a result of the procedure of high-pass filtering, however, the signal SP' acquired in this way is blurred compared to the original spike signal SP. This arises from the point spread function of the high-pass filtering. In order to keep the point spread function as narrow as possible, the high-pass filter should cut the measured signal exactly with the bandwidth of the nuclear magnetic resonance signal.

Another problem is that the obtained signal also contains a noise part. The signal SP' deriving from the spike signal must also be differentiated from the noise signal. In the simplest case, one could conceive of doing this with a fixed threshold, however, only an incomplete identification of spike signals could thus be achieved, since this simple method would not, for example, take into consideration whether the signal is more or less noise-infested overall. When, for example, the threshold is set low, noise-infested signals that definitely still lie in the range of what is usable would be completely discarded since the noise would be identified as spikes. When, on the other hand, the threshold is set too high, then spikes would no longer be capable of being recognized. The statistical method applied here is more reliable.

A well-suited statistical method for identifying spikes is, for example, the Z-score or a modified Z-score method. The Z-score $Z_i$ is defined by:

$$Z_i = \frac{(X_i - \overline{X})}{\sigma}$$

$Z_i$ is thereby the $i^{th}$ Z-score value; $X_i$ is the $i^{th}$ sample; $\overline{x}$ is the average of the samples and $\sigma$ is the standard deviation. The level of the threshold for the Z-score value $Z_i$, who now determines whether the allocated samples $X_i$ are identified as spikes or as noise. For example, a threshold $|Z_i|>3$ has proven expedient.

In the modified Z-score method, a value $M_i$ is defined as:

$$M_i = \frac{0.67465(X_i - \overline{X})}{\text{median } \{|X_i - \overline{X}|\}}$$

wherein $M_i$ the $i^{th}$ modified Z-score value; $X_i$ is the $i^{th}$ sample and median $\{|X_i-\overline{x}|\}$ is the median value of the amount of the difference of the $i^{th}$ sample and the average of all samples.

In the modified Z-score method, samples would be evaluated as spikes when, for example, $|M_i|>3.5$.

By contrast to an evaluation based on amplitude, these statistical evaluations have the advantage that they operate independently of the amplitude of the samples. The threshold for the Z-score value can be selected independently of the respective measuring conditions.

The statistical reliability becomes dependent on the standard deviation, ie., the noise level is also taken into consideration.

If it becomes apparent during operation that signals are being erroneously identified as spikes, the threshold for the Z-score value can be raised. This can also ensue in an iterative method. For example, one can start with a low threshold for the Z-score value and raises this threshold when it appears that spikes are erroneously identified. The probability of misinterpretation due to the point spread function of the high-pass filter or poor noise conditions is thus reduced.

A particular advantage of the method is controlling that the sole parameters, namely the limit frequency of the high-pass filter (that is selected equal to the bandwidth of the MR signal) and the threshold for the Z-score method, are beta-independent.

When a sample is identified as spike according to this method, it is replaced in the raw data matrix. The value zero can be selected as the substitute value in the simplest case. The spike-caused artifacts in the image are already largely eliminated with this simple measure, however, better results are obtained when the sample is replaced by a value interpolated from the neighboring values. These can be neighboring values in a row of the raw data matrix, but can also be neighboring values in the column direction of the raw data matrix.

An image is then calculated from the corrected raw data matrix in a conventional way on the basis of two-dimensional Fourier transformation.

The crux of the disclosed method, namely the high-pass filtering, could also be fundamentally implemented in terms of hardware, however, the software resolution is preferred since this requires no hardware modifications of the system. The software solution involves little outlay since, for example, the inverse Fourier transformation required for the high-pass filtering is already implemented in the row direction for the imaging. The method can be implemented as a one-dimensional Fourier transformation method, thereby shortening the calculating time.

With the disclosed method, spikes are identified with little outlay and high reliability, and spike-caused artifacts can be largely avoided by subsequent correction of the raw data matrix.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for identifying spikes in MR signals, comprising the steps of:
    (a) obtaining an MR signal containing a signal contribution arising from nuclear spins, and possibly also containing spikes and noise;
    (b) high-pass filtering the MR signal with a limit frequency of the high-pass filtering selected such that said signal contribution arising from nuclear spins signal without said spikes is filtered out; and
    (c) conducting a statistical evaluation to determine whether the high-pass filtered MR signal contains spikes distinguishable from said noise.

2. A method according to claim 1, comprising acquiring a time position of spikes in the MR signal.

3. A method according to claim 2, comprising replacing the MR signal for time positions at which a spike was recognized.

4. A method according to claim 3, comprising replacing the MR signal with an interpolated value obtained from values neighboring in time for time positions at which a spike was recognized.

5. A method according to claim 4, wherein step (a) comprises acquiring the MR signals in an at least two-dimensional k-space, and obtaining the interpolated value by interpolation from neighboring values in the k-space.

6. A method according to claim 1, wherein step (b) comprises:

(d) inverse Fourier transforming the MR signal and thereby acquiring a signal S';

(e) eliminating values of the signal S' in a frequency band allocated to the MR signal and thereby acquiring a signal S"; and (f) Fourier transforming the signal S" for identifying a spike signal.

7. A method according to claim 6, wherein step (e) comprises setting the values of the signal S' allocated to the MR signal to zero.

8. A method according to claim 1, comprising analog demodulating, low-pass filtering and analog-to-digital converting the MR signal before step (b).

9. A method according to claim 1, comprising analog-to-digital converting said MR signal before step (b) and demoduling said high-pass filtered signal.

10. A method according claim 1, comprises conducting said statistical evaluation according to the Z-score method, including identifying $i^{th}$ sampled measured value as a spike when an allocated value $Z_i$ exceeds a threshold, whereby the following is valid:

$$Z_i = \frac{(X_i - \overline{X})}{\sigma}$$

wherein $X_i$ is the $i^{th}$ sampled measured value, $\overline{X}$ is the average of all sampled measured values and $\sigma$ is the standard deviation of all sampled measured values.

11. A method according to claim 1 comprising conducting said statistical evaluation according to a modified Z-score method, including identifying an $i^{th}$ sampled measured value as a spike when an allocated value $M_i$ exceeds a thresh hold, whereby:

$$M_i = \frac{0.67465(X_i - \overline{X})}{\text{median } \{|X_i - \overline{X}|\}}$$

wherein $X_i$ is the $i^{th}$ sampled measured value and $\overline{X}$ is the average of all sampled measured values.

* * * * *